US007429178B2

(12) United States Patent
Givens et al.

(10) Patent No.: US 7,429,178 B2
(45) Date of Patent: Sep. 30, 2008

(54) MODULAR JACK WITH REMOVABLE CONTACT ARRAY

(75) Inventors: David Givens, Red Lion, PA (US); John Hynes, Prospect, KY (US); Douglas McCartin, Greenville, IN (US); Douglas Wathen, Floyds Knobs, IN (US)

(73) Assignee: Samtec, Inc., New Albany, IN (US)

( * ) Notice: Subject to any disclaimer, the term of this patent is extended or adjusted under 35 U.S.C. 154(b) by 0 days.

(21) Appl. No.: 11/531,014

(22) Filed: Sep. 12, 2006

(65) Prior Publication Data

US 2008/0064266 A1 Mar. 13, 2008

(51) Int. Cl.
*H05K 1/00* (2006.01)

(52) U.S. Cl. ........................................ 439/79; 439/676

(58) Field of Classification Search ................. 439/676, 439/607, 609, 540.1, 79
See application file for complete search history.

(56) References Cited

U.S. PATENT DOCUMENTS

| | | | |
|---|---|---|---|
| 4,789,847 | A | 12/1988 | Sakamoto et al. |
| 4,894,630 | A | 1/1990 | Ueta et al. |
| 5,015,204 | A | 5/1991 | Sakamoto et al. |
| 5,069,641 | A | 12/1991 | Sakamoto et al. |
| 5,118,300 | A | 6/1992 | Zarreii |
| 5,139,442 | A | 8/1992 | Sakamoto et al. |
| 5,157,244 | A | 10/1992 | Mroczkowski et al. |
| 5,269,705 | A | 12/1993 | Iannella et al. |
| 5,277,625 | A | 1/1994 | Iannella et al. |
| 5,282,759 | A | 2/1994 | Sakamoto et al. |
| 5,295,869 | A | 3/1994 | Siemon et al. |
| 5,306,196 | A | 4/1994 | Hashiguchi |
| 5,321,247 | A | 6/1994 | Mroczkowski et al. |
| 5,342,220 | A | 8/1994 | Kodama |
| 5,352,995 | A | 10/1994 | Mouissie |
| 5,357,226 | A | 10/1994 | Azuma |
| 5,360,353 | A | 11/1994 | Kinoshita |
| 5,362,254 | A | 11/1994 | Siemon et al. |
| 5,397,250 | A | 3/1995 | Briones |
| 5,403,207 | A | 4/1995 | Briones |
| 5,409,401 | A | 4/1995 | Schaarschmidt et al. |
| 5,435,752 | A | 7/1995 | Siemon et al. |
| 5,459,643 | A | 10/1995 | Siemon et al. |
| 5,474,474 | A | 12/1995 | Siemon et al. |
| 5,513,065 | A | 4/1996 | Caveney et al. |
| 5,563,761 | A | 10/1996 | Apa et al. |
| 5,587,884 | A | 12/1996 | Raman |
| 5,647,767 | A | 7/1997 | Scheer et al. |
| 5,687,233 | A | 11/1997 | Loudermilk et al. |
| 5,697,817 | A | 12/1997 | Bouchan et al. |
| 5,759,067 | A | 6/1998 | Scheer |
| 5,791,945 | A | 8/1998 | Myer et al. |
| 5,802,912 | A | 9/1998 | Pitzer et al. |
| 5,869,818 | A | 2/1999 | Kim |
| 5,872,492 | A | 2/1999 | Boutros |
| 5,876,240 | A | 3/1999 | Derstine et al. |
| 5,878,132 | A | 3/1999 | Sakamoto et al. |

(Continued)

*Primary Examiner*—Khiem Nguyen
(74) *Attorney, Agent, or Firm*—Keating & Bennett, LLP

(57) ABSTRACT

A modular jack includes a housing having a socket and an opening arranged to receive a modular plug into the socket, and a sled including a contact array arranged within the socket, wherein the sled is removable from the socket through the opening of the housing without disassembling the housing.

16 Claims, 10 Drawing Sheets

U.S. PATENT DOCUMENTS

| | | | |
|---|---|---|---|
| 5,940,959 | A | 8/1999 | Caveney et al. |
| 5,971,805 | A | 10/1999 | Belopolsky et al. |
| 5,971,812 | A | 10/1999 | Martin |
| 5,971,813 | A | 10/1999 | Kunz et al. |
| 6,010,367 | A | 1/2000 | Wu |
| 6,022,245 | A | 2/2000 | Minich |
| 6,062,908 | A | 5/2000 | Jones |
| 6,113,422 | A | 9/2000 | Somerville et al. |
| 6,116,963 | A | 9/2000 | Shutter |
| 6,135,819 | A | 10/2000 | Lin |
| 6,171,152 | B1 | 1/2001 | Kunz |
| 6,176,741 | B1 | 1/2001 | Shutter |
| 6,183,292 | B1 | 2/2001 | Chen et al. |
| 6,224,425 | B1 | 5/2001 | Shutter |
| 6,227,911 | B1 | 5/2001 | Boutros et al. |
| 6,231,397 | B1 | 5/2001 | de la Borbolla et al. |
| 6,238,247 | B1 | 5/2001 | Belopolsky et al. |
| 6,276,965 | B1 | 8/2001 | Madsen et al. |
| 6,276,968 | B1 | 8/2001 | Belopolsky |
| 6,302,741 | B1 | 10/2001 | Fasold et al. |
| 6,305,950 | B1 | 10/2001 | Doorhy |
| 6,319,064 | B1 | 11/2001 | Belopolsky et al. |
| 6,325,664 | B1 | 12/2001 | Someda et al. |
| 6,371,793 | B1 | 4/2002 | Doorhy et al. |
| 6,381,283 | B1 | 4/2002 | Bhardwaj et al. |
| 6,409,548 | B1 | 6/2002 | Guttierez |
| 6,418,029 | B1 | 7/2002 | McKee et al. |
| 6,425,781 | B1 | 7/2002 | Bernstein et al. |
| 6,428,361 | B1 | 8/2002 | Imschweiler et al. |
| 6,431,764 | B1 | 8/2002 | Scharf et al. |
| 6,483,715 | B1 | 11/2002 | Chen |
| 6,509,807 | B1 | 1/2003 | Anthony et al. |
| 6,515,842 | B1 | 2/2003 | Hayworth et al. |
| 6,527,594 | B1 | 3/2003 | Korsunsky et al. |
| 6,537,110 | B1 | 3/2003 | Korsunsky et al. |
| 6,554,638 | B1 | 4/2003 | Hess et al. |
| 6,568,966 | B1 | 5/2003 | Korsunsky et al. |
| 6,585,540 | B2 | 7/2003 | Gutierrez et al. |
| 6,606,011 | B2 | 8/2003 | Anthony et al. |
| 6,612,871 | B1 | 9/2003 | Givens |
| 6,638,112 | B1 | 10/2003 | Walker et al. |
| 6,650,525 | B2 | 11/2003 | Anthony |
| 6,663,437 | B2 | 12/2003 | Korsunsky et al. |
| 6,702,618 | B1 | 3/2004 | Hyland et al. |
| RE38,519 | E | 5/2004 | Doorhy et al. |
| 6,739,915 | B1 | 5/2004 | Hyland et al. |
| 6,749,467 | B2 | 6/2004 | Korsunsky et al. |
| 6,752,664 | B2 | 6/2004 | Hyland et al. |
| 6,758,698 | B1 | 7/2004 | Caveney et al. |
| 6,769,936 | B2 | 8/2004 | Gutierrez et al. |
| 6,773,302 | B2 | 8/2004 | Gutierrez et al. |
| 6,799,989 | B2 | 10/2004 | Doorhy et al. |
| 6,840,779 | B2 | 1/2005 | Eberle et al. |
| 6,863,575 | B2 | 3/2005 | Hyland |
| 6,873,513 | B2 | 3/2005 | Anthony |
| 6,878,012 | B2 | 4/2005 | Gutierrez et al. |
| 6,881,096 | B2 | 4/2005 | Brown et al. |
| 6,894,884 | B2 | 5/2005 | Anthony, Jr. et al. |
| 6,896,553 | B2 | 5/2005 | Espenshade et al. |
| 6,918,790 | B2 | 7/2005 | Wan et al. |
| 6,918,791 | B2 | 7/2005 | Wan et al. |
| 6,923,673 | B2 | 8/2005 | Doorhy et al. |
| 6,942,521 | B1 | 9/2005 | Jatou et al. |
| 6,954,346 | B2 | 10/2005 | Anthony |
| 6,957,982 | B1 | 10/2005 | Hyland et al. |
| 6,962,511 | B2 | 11/2005 | Gutierrez et al. |
| 6,986,684 | B1 | 1/2006 | Lien |
| 6,995,983 | B1 | 2/2006 | Anthony et al. |
| 7,042,303 | B2 | 5/2006 | Anthony et al. |
| 7,042,703 | B2 | 5/2006 | Anthony et al. |
| 7,050,284 | B2 | 5/2006 | Anthony |
| 7,052,328 | B2 | 5/2006 | Ciezak et al. |
| 7,090,535 | B2 | 8/2006 | Wan et al. |
| 7,106,570 | B2 | 9/2006 | Anthony, Jr. et al. |
| 7,118,380 | B1 | 10/2006 | Kraz et al. |

MODULAR JACK WITH REMOVABLE CONTACT ARRAY

BACKGROUND OF THE INVENTION

1. Field of the Invention

The present invention relates to modular jacks. More specifically, the present invention relates to modular jacks in which a contact array of the modular jack may be easily removed and replaced.

2. Description of the Related Art

Modular connectors are used in computer, telecommunication, data transmission networks, and other similar networks as an input/output connection or interface between communication lines or electronic equipment of the networks. Common modular connectors include RJ-11 and RJ-45 connectors, for example. Modular connectors include a female portion, referred to as a modular jack, and a male portion, referred to as a modular plug.

A conventional modular jack includes a housing having a socket arranged to receive the modular plug. The modular jack is typically permanently mounted to a circuit board such that the modular plug may be easily inserted into the socket and easily disconnected from the socket. When the modular plug is inserted into the socket of the modular jack, the wires or contacts in the modular plug make electrical contact with a metal wire contact array arranged within the housing of the modular jack. The terminals of the contact array are often directly inserted into and soldered to the circuit board. A modular plug may be inserted into and disconnected from a modular jack (referred to as "a mating cycle") many times.

Over the life of the modular jack, the contact array within the housing will be become worn and damaged by frequent insertions and disconnections of the modular plug into and from the socket. For example, 5,000 mating cycles has conventionally been the upper limit for high quality modular jacks.

Because conventional contact arrays have been integral with the modular jack housing, the entire modular jack must be replaced when the contact array becomes worn or damaged. Replacing the entire modular jack is a labor intensive and costly process.

Conventionally, replacing the modular jack included returning the entire product having the modular jack to a repair facility. Technicians had to disassemble the product, isolate the bad jack, unsolder the modular jack with special equipment, clean and prepare the circuit board, place the new modular jack on the circuit board, resolder, reassemble the end product, and test the new modular jack. Frequently, because of the time and cost of this process, the product was scrapped rather than performing such a costly, difficult and labor-intensive repair.

Attempts have been made to extend the life of the modular jack by using a conductive lubricant between the contact array and the modular plug and by plating the contact array with exotic metals. Neither of these options has satisfactorily extended the life of the modular jack.

In extreme cases where reliability is critical, the modular jack may be contained within a disconnectable module for convenient replacement. Here, the product must be specially designed to accommodate a module utilizing additional connectors and enhanced packaging, resulting in far higher costs. Replacing the disconnectable module includes replacing the entire modular jack, resulting in replacing parts of the modular jack that are not worn or damaged, further increasing costs.

Modular jacks are also used as test ports in electronic equipment. Diagnostic data (usually 500 MHz, or less) are transmitted through a test circuit, the modular jack mounted on a circuit board, and a cable connected to an analyzer to study the electronic equipment. When not in use, the modular jack connected to the test circuit becomes an electrical stub. The electrical stub radiates unwanted radio frequency emissions causing several EMI/RFI (Electro Magnetic Interference/Radio Frequency Interference) problems, which can cause the electronic equipment to fail FCC emissions tests. The worst offending electrical stub is often an unmated modular jack because it is free-standing and because the contacts of the contact array are no longer coupled to and protected by ground planes within the circuit board. Further, the contact array resides in a port opening in the electronic equipment's exterior case. This is a worst case scenario for unwanted EMI/RFI noise propagation.

Permanently mounted modular jacks may also lead to loss of costly or sensitive data due to easy access to the data port. Conventional protective measures, including port covers for blocking plug entry, electronics to disrupt signal transmission, and non-standard keying, all generate higher costs and manufacturing times. Furthermore, the contact array within the modular jack may act as an antenna radiating radio frequencies that may be intercepted with electronic eavesdropping equipment.

SUMMARY OF THE INVENTION

In order to overcome the problems described above, preferred embodiments of the present invention provide a modular jack including a housing having a socket and an opening arranged to receive a modular plug into the socket, and a sled including a contact array arranged within the socket, wherein the sled is removable from the socket through the opening of the housing without disassembling the housing. Preferably, the housing includes a shield and an internal housing.

According to another preferred embodiment, the housing includes at least one element arranged to engage at least one element on the sled, and the sled is locked into the housing when the at least one element of the sled is engaged by the at least one element of the housing.

According to another preferred embodiment, the contact array includes a plurality of contacts arranged to make electrical contact with the modular plug. Preferably, each of the contacts is removably mounted in the sled such that the contacts may be selectively removed or inserted therein.

According to another preferred embodiment, the sled includes at least one additional component arranged to modify at least one signal transmitted through the modular jack, and the at least one additional component is arranged on the sled such that the at least one component is removed from the housing when the sled is removed from the housing. Preferably, the at least one additional component is arranged to modify the signal through amplification, noise suppression or filtration, impedance matching, voltage isolation, magnetic filtering, ESD protection, resistive termination, shunt programming, solid state/active compensation, and differential signal equalization.

According to another preferred embodiment, a modular jack assembly includes a plurality of modular jacks arranged in-line and/or stacked vertically, wherein at least one of the plurality of modular jacks is arranged according to one of the preferred embodiments described above.

According to another preferred embodiment, a modular jack assembly includes a modular jack according to one of the preferred embodiments described above, a circuit board having at least one electrical contact, the modular jack being mounted on the circuit board, wherein the sled is removable from the socket through the opening of the housing without removing the housing from the circuit board.

According to another preferred embodiment, the contact array includes a plurality of contacts, each having a terminal end, and the terminal end of each of the plurality of contacts is in direct contact with a corresponding one of the at least one electrical contact.

According to another preferred embodiment, the sled includes at least one additional component arranged to modify at least one signal transmitted through the modular jack, and the at least one additional component is arranged on the sled such that the at least one additional component is removed from the housing when the sled is removed from the housing. Preferably, the at least one additional component is arranged to modify the signal through amplification, noise suppression or filtration, impedance matching, voltage isolation, magnetic filtering, ESD protection, resistive termination, shunt programming, solid state/active compensation, and differential signal equalization.

According to another preferred embodiment, the contact array includes a plurality of contacts, and the at least one additional component is arranged between at least one of the plurality of contacts and the at least one electrical contact of the circuit board.

According to another preferred embodiment, an electronic device includes one of the preferred embodiments described above.

According to another preferred embodiment, a method of replacing a modular jack includes providing a modular jack including a housing having a socket and an opening arranged to receive a modular plug into the socket, providing a sled including a contact array arranged within the socket, and removing the sled through the opening of the housing without disassembling the housing. Preferably, the step of removing the sled includes inserting a tool into the socket between the sled and the housing to disengage the sled from the housing.

According to another preferred embodiment, the method includes providing the sled with at least one additional component arranged to modify at least one signal transmitted through the modular jack, wherein the at least one additional component is arranged on the sled such that the at least one additional component is removed from the housing when the sled is removed from the housing. Preferably, the at least one additional component is arranged to modify the signal through amplification, noise suppression or filtration, impedance matching, voltage isolation, magnetic filtering, ESD protection, resistive termination, shunt programming, solid state/active compensation, and differential signal equalization.

The modular jack according to the various preferred embodiments of the present invention provides virtually unlimited mating cycles of inserting and disconnecting the plug into and from the modular jack (e.g., from 50,000 to over 100,000 mating cycles), eliminates the need to remove the modular jack from a circuit board when replacing the contact array, and allows the contact array to be easily removed when the modular jack is not in use. The removal of the contact array when not in use reduces the stub length of the modular jack, which eliminates electromagnetic and radio frequency output, and secures the modular jack from unwanted access. Furthermore, providing at least one additional electronic component on the removable sled for modifying the electrical signal transmitted through the modular jack permits easy inspection and diagnosis of the additional component when the sled is removed from the modular jack.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
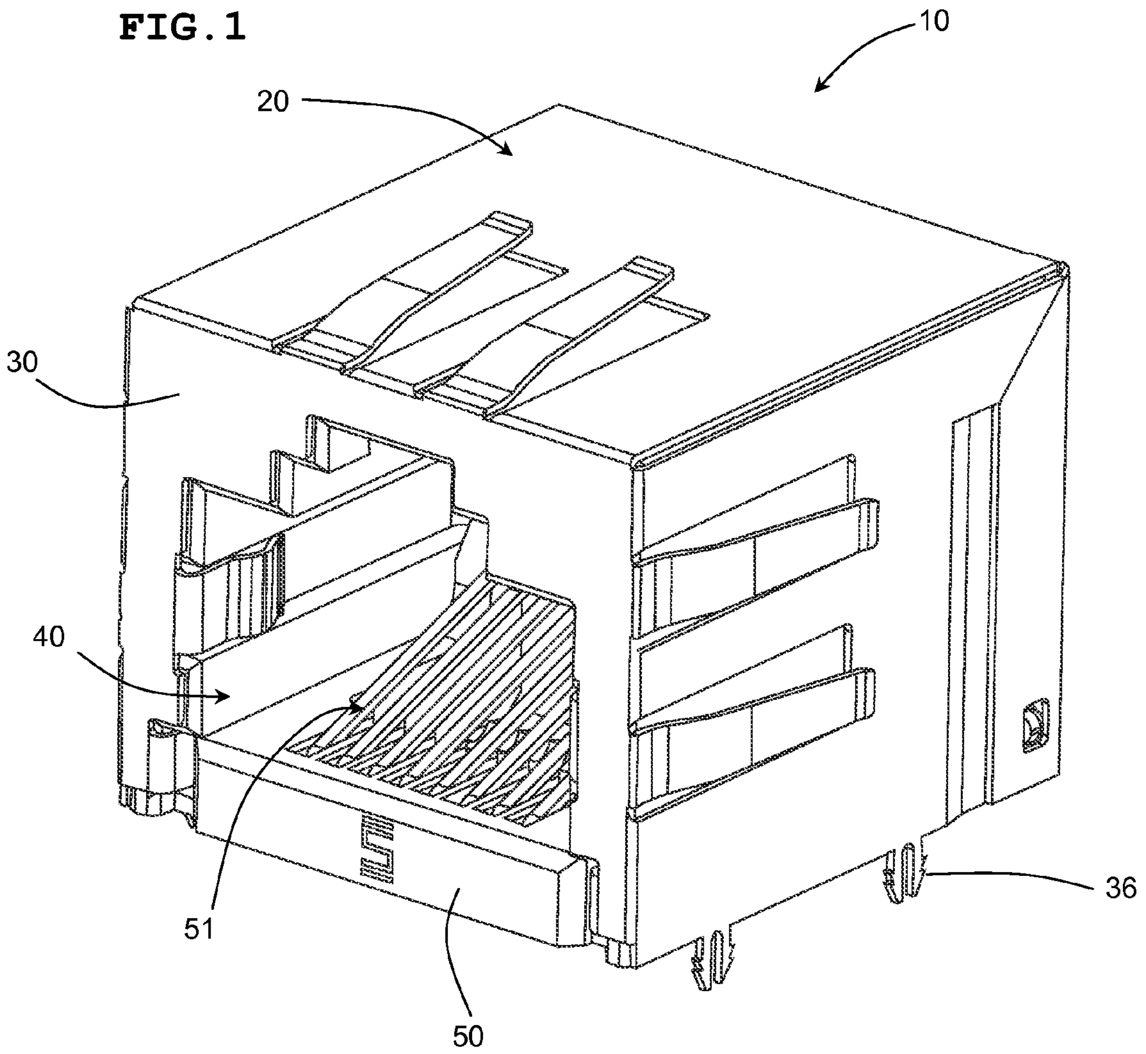
FIG. 1 is a perspective view of a modular jack including a housing and a sled according to a first preferred embodiment of the present invention.
Figure 2:
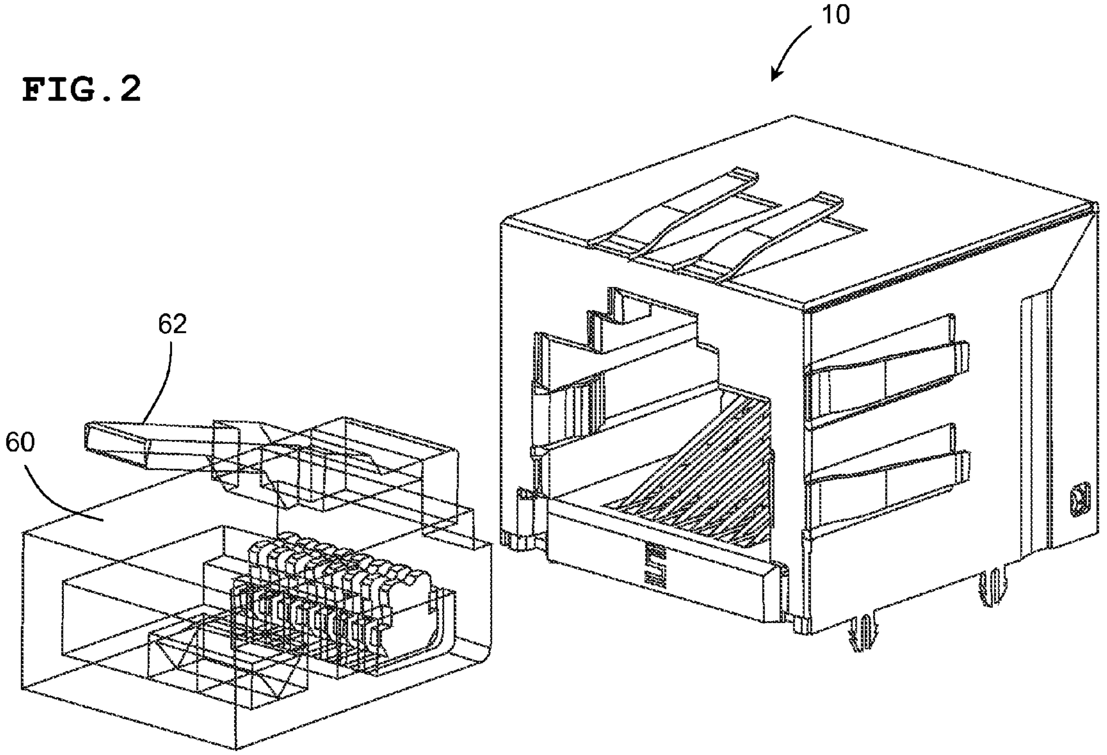
FIG. 2 is a perspective view of a modular plug and the modular jack.
Figure 3:
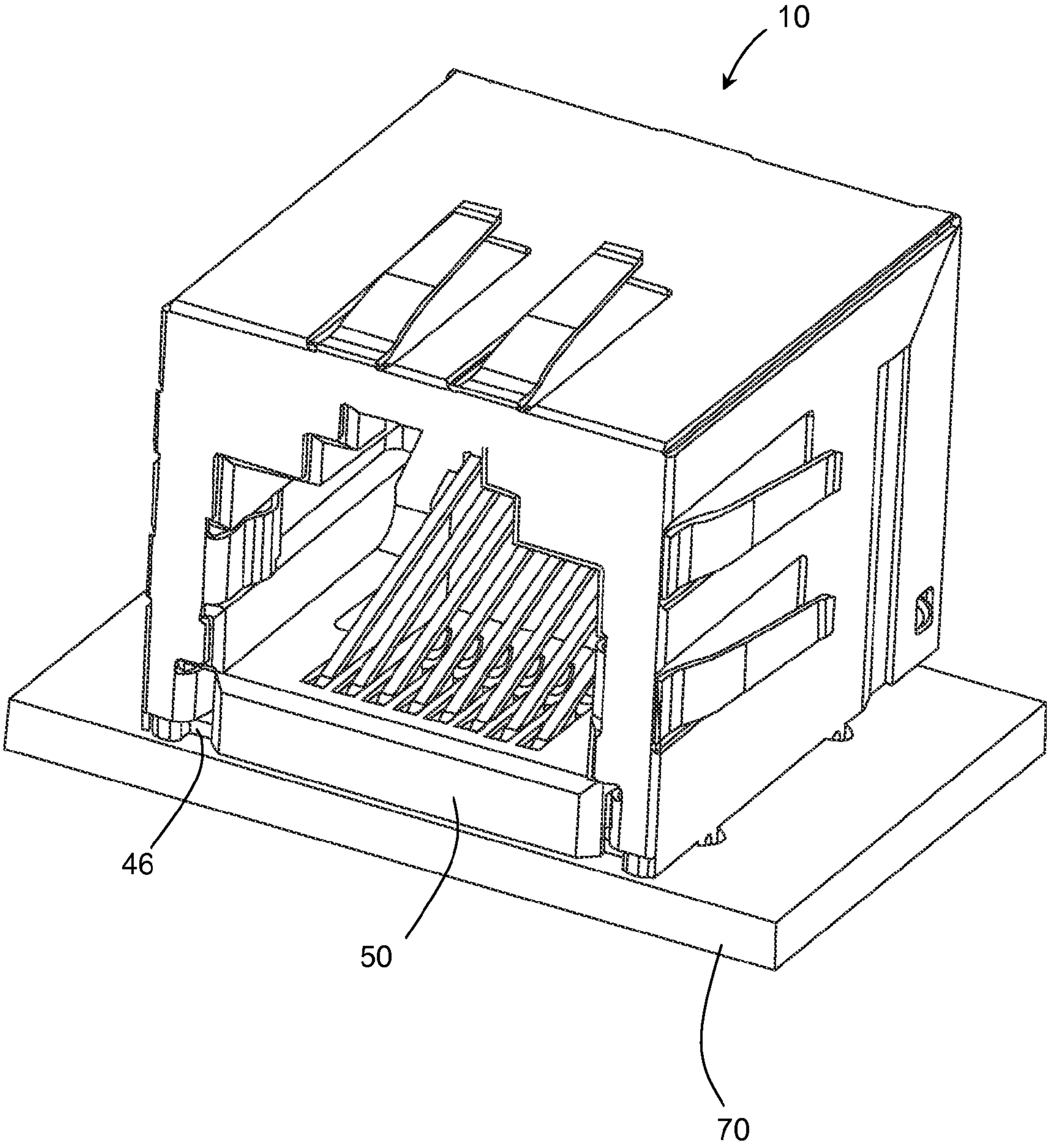
FIG. 3 is a perspective view of the modular jack mounted on a circuit board.

Referring to FIG. 1, a modular jack 10 preferably includes a housing 20 including an external EMI/RFI shield 30 and an internal housing 40, and a removable sled 50 having a contact array 51. Alternatively, the housing 20 may omit the EMI/RFI shield 30, or the internal housing 40 may include more than one housing. FIG. 2 shows a modular plug 60 oriented in front of an opening of the housing 20 before being inserted into the housing 20. A cable, which typically includes at least two wires, which would normally terminate at the modular plug 60, is not shown in FIG. 2. The modular jack 10 includes a port opening for receiving the modular plug 60. Alternatively, the modular jack 10 may include two or more openings. The opening in the housing 20 is arranged to receive the modular plug 60 into the socket of the housing 20. The opening in the housing 20 may be located on the side of the housing 20 for providing a right angle, or side, entry as shown in FIG. 2, or may be located on the top of the housing for providing a top entry (not shown). FIG. 3 shows the modular jack 10 mounted on a circuit board 70. The circuit board 70 can be a printed circuit board or any other suitable substrate or platform on which the modular jack 10 can be placed or mounted.

Referring again to FIG. 2, the modular plug 60 includes a tab 62 to lock the modular plug into the modular jack 10. The tab 62 is depressed when inserting the modular plug 60 into the modular jack 10 and depressed in order to allow the modular plug 60 to be disconnected from the modular jack 10. The housing 20 includes a space arranged to receive the tab 62. The tab 62 may be arranged on the top, bottom, or sides of the modular plug 60. Accordingly, the spaces may be arranged on the top, bottom, or sides of the opening in the housing 20.

Figure 4:
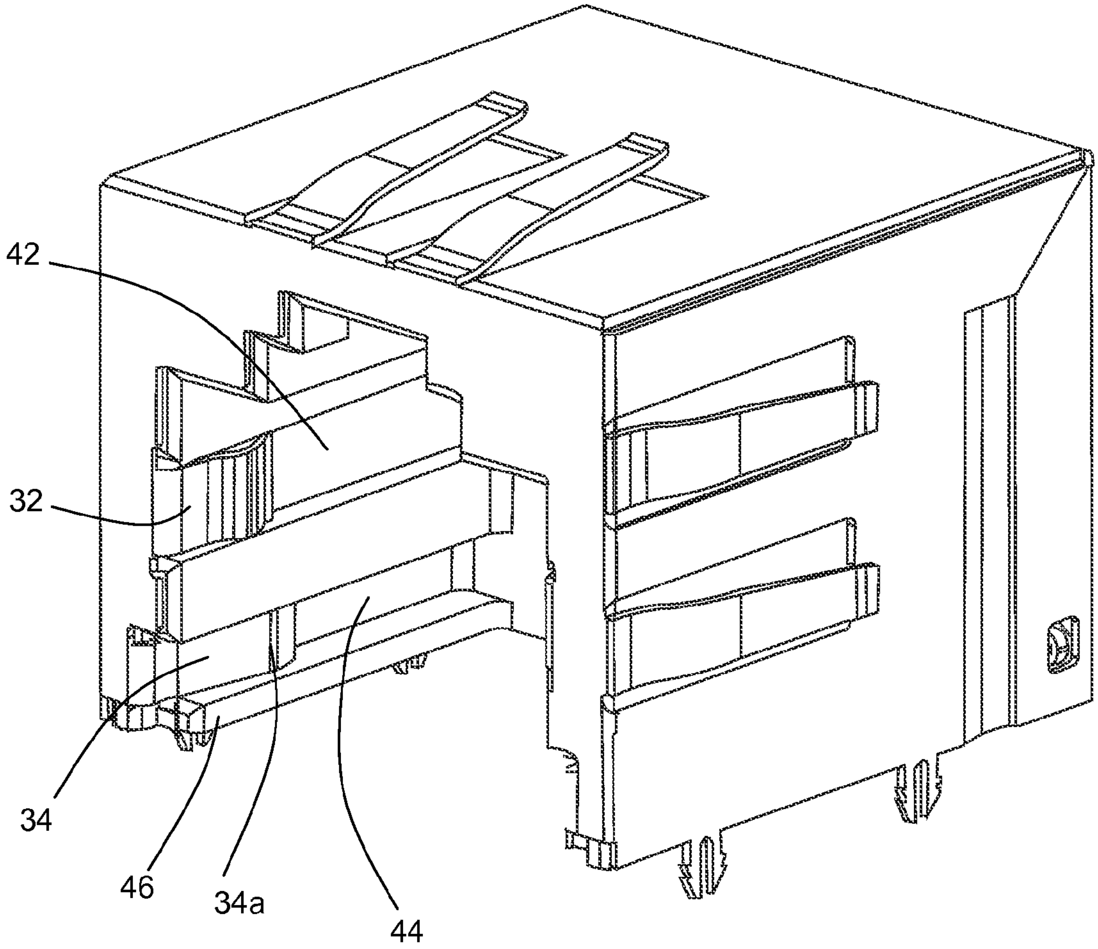
FIG. 4 is a perspective view of the housing without the sled.

Referring to FIG. 4, the external EMI/RFI shield 30 preferably surrounds the internal housing 40 on all sides except for the opening in the housing 20, which in this preferred embodiment is in the front of the housing 20, and the bottom of the housing 20 mounted to the circuit board 70. As discussed above, the opening may be provided on any one of the sides of the modular jack housing, including the top.

The external EMI/RFI shield 30 preferably includes an upper latch 32 and a lower latch 34. The external EMI/RFI shield 30 may be attached to the internal housing 40 using the upper latch 32 and the lower latch 34 or any other suitable connectors, or the internal housing 40 may be press-fitted into the external EMI/RFI shield 30. However, the EMI/RFI shield 30 and the internal housing 40 may be attached to each other by any other suitable method. The external EMI/RFI shield 30 is preferably attached to the circuit board 70 by mounts 36. The external EMI/RFI shield 30 is preferably made of a conductive material, for example, metal, to shield the modular jack 10 from external electromagnetic interference (EMI) or radio frequency interference (RFI) and to contain internal electromagnetic radiation and radio frequency signals within the modular jack 10. The upper latch 32 may function as the ground path between the modular jack 10 and a shield of the modular plug 60, if the modular plug 60 and cable are shielded.

The internal housing 40 is preferably made of an electrically insulating material, for example, a plastic. The internal housing 40 preferably includes an upper channel 42 and a lower channel 44 arranged to receive the upper latch 32 and the lower latch 34 of the external EMI/RFI shield 30, respectively. A protrusion 46 extends inwardly and along the sides of the internal housing 40 to define the bottom of the lower channel 44. As described below, the protrusion 46 extends into a groove 56 of the sled 50 (shown in FIG. 5) to more securely position the sled 50 within the internal housing 40.

Figure 5:
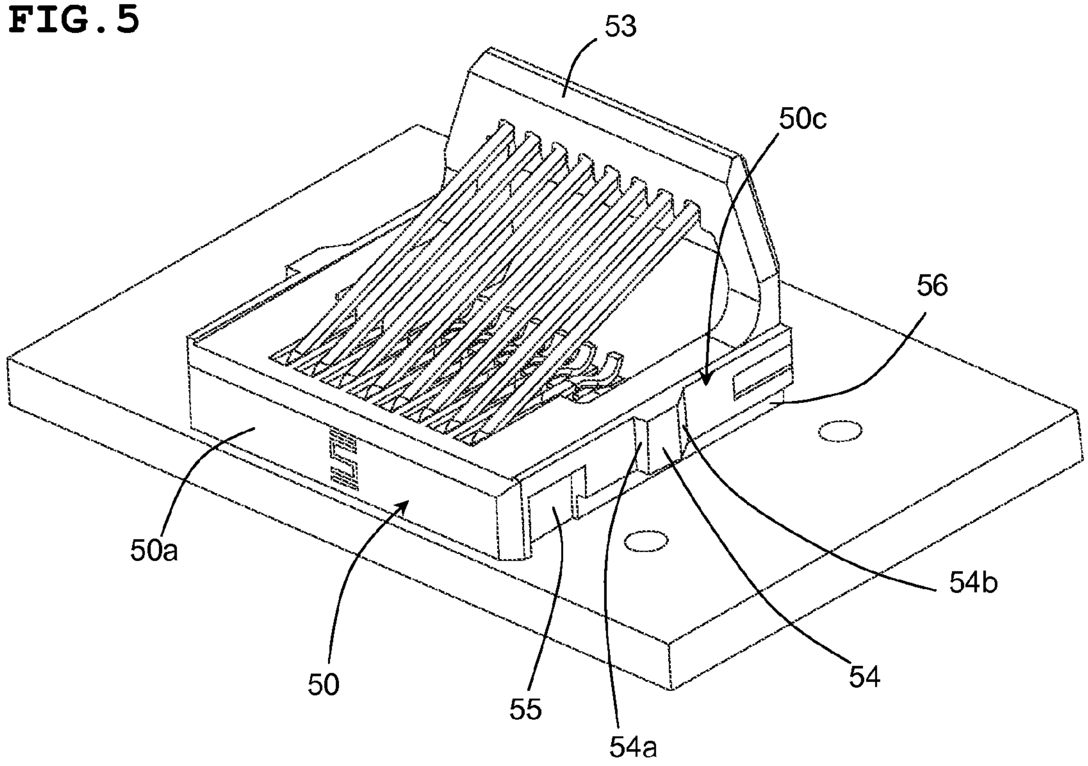
FIG. 5 is a perspective view of the sled on the circuit board without the housing.
Figure 6:
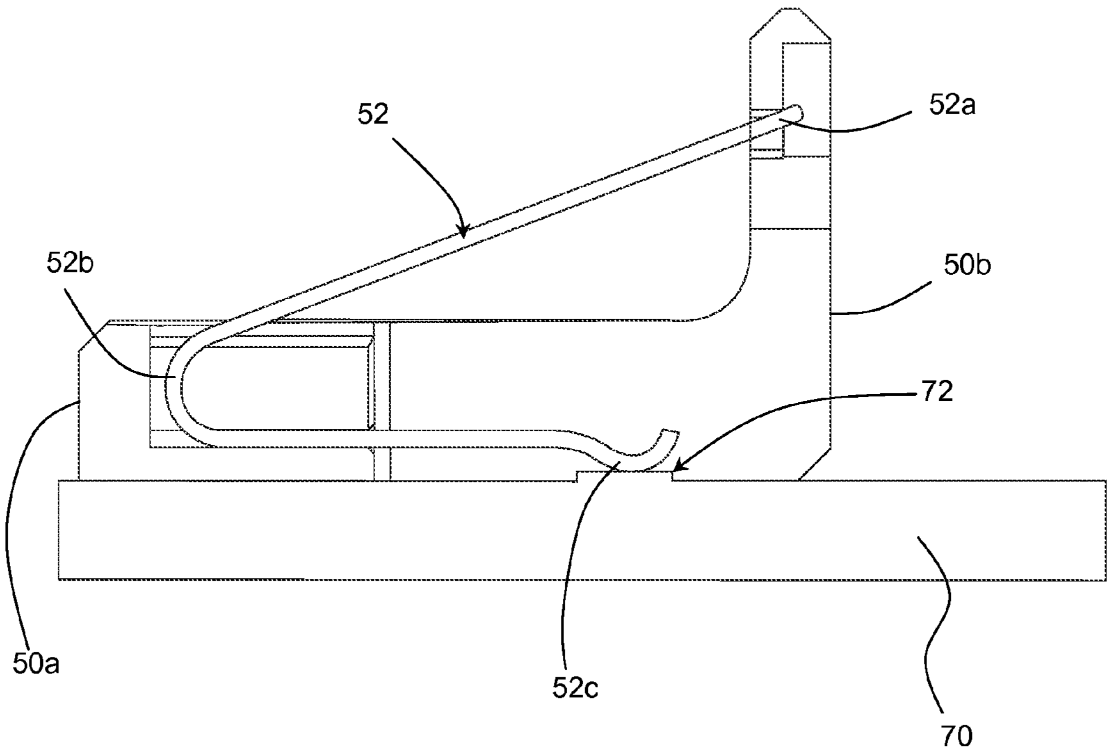
FIG. 6 is a side view of the sled in electrical contact with the circuit board.

Referring to FIG. 1 and FIG. 5, the sled 50 is removably inserted through the opening into the socket of the internal housing 40 of the modular jack 10. Referring to FIG. 5 and FIG. 6, the sled 50 includes a contact array 51 having a plurality of metal contacts 52, each having a first end 52*a* held in notches of a beam 53 and extending from the beam 53 downward and toward the front 50*a* of the sled 50. At the front 50*a* of the sled 50, the contacts 52 are bent backwards at curved portions 52*b* toward the back 50*b* of the sled 50. The curved portions 52*b* of the contacts are held in notches in the front 50*a* of the sled 50. The contacts 52 extend parallel or substantially parallel to the bottom of the sled 50 and terminate in contact terminals 52*c* that are convexly curved to protrude slightly below the bottom plane of the sled 50. The curved portions 52*b* of the contacts 52 are held in the notches in the front 50*a* of the sled 50 such that elastic or spring forces of the contacts 52 press the first ends 52*a* of the contacts 52 into the notches of the beam 53 and press the contact terminals 52*c* in a downward direction to contact with lands 72 on the circuit board 70. This arrangement ensures a good mechanical connection between the contact terminals 52*c* and the lands 72, which also ensures a good electrical connection, without soldering the contact terminals 52 to the lands 72.

The present invention is not limited to the above arrangement of the contacts 52 within the contact array 51. The contacts may be of any suitable shape, or held within the sled 50 in any other suitable manner. For example, the contacts 52 may have a bellows or rams-head shape.

As described below, the contact terminals 52*c* may make contact with at least one additional component 90 mounted to the sled 50, as opposed to directly contacting the lands 72 on the circuit board 70.

Instead of having the contact terminals 52*c* contact the lands 72 on the circuit board 70, the contact terminals 52*c* can engage terminals (not shown) within the housing 20 that are electrically connected to a circuit in or on the circuit board 70. This arrangement, however, has the drawback of increasing the stub length by the length of the terminals in the housing 20. Alternatively, the contact terminals 52*c* may contact with conductive portions of the sled 50 which contact the lands 72.

Referring to FIGS. 4 and 5, the sides 50*c* of the sled 50 slide into the lower channel 44 of the internal housing 40. A groove 56 along each side 50*c* of the sled 50 is arranged to receive the protrusion 46 arranged along the bottom of the internal housing 40. Each side 50*c* of the sled 50 includes a bump 54 for engaging the lower latch 34 and includes a slot 55 recessed within the side 50*c* for receiving a specially adapted tool for removing the sled 50 from the housing 20, which will be described below.

The lower latch 34 of the external EMI/RFI shield 30 extends along the lower channel 44 of the internal housing 40. A protruding portion 34*a* of the lower latch 34 protrudes away from an inner surface of the lower channel 44 and toward the interior of the socket. As described below, the protruding portion 34*a* engages with the front edge 54*a* of the bump 54 when the sled 50 is fully inserted into the internal housing 40.

The sides 50*c* of the sled 50 are guided into the lower channels 44 of the internal housing 40 with the bumps 54 engaging the lower latches 34. As the sled 50 is inserted into the housing 20, the protruding portions 34*a* of the lower latches 34 contact and slide over the tapered rear edges 54*b* of the bumps 54. Upon complete insertion of the sled 50, the protruding portions 34*a* of the lower latches 54 snap away from the inner surface of the lower channels 44 and engage the front edges 54*a* of the bumps 54. The contact of the protruding portions 34*a* of the lower latches 34 with the front edges 54*a* of the bumps 54 lock the sled 50 into the internal housing 40. The sled 50, and thus the contact array 51, is securely inserted into the socket of the modular jack 10. The sled 50 is locked in the internal housing 40 until the protruding portions 34*a* of the lower latches 34 are forced toward the inner surfaces of the lower channels 44 so as to not engage the front edges 54*a* of the bumps 54.

The above latching arrangement is merely a preferred embodiment of the present invention. The upper latch 32 and the lower latch 34 may be replaced with more or less latches, and one or more of the latches may secure the sled 50 in the housing 20. Alternatively, the latches may be provided on the internal housing 40 as opposed to the external EMI/RFI shield 30. Furthermore, latches may be provided on the sled 50 with corresponding mating portions on the housing 20. The present invention may utilize any system or structure that securely holds the sled 50 in the housing 20.

Figure 7:
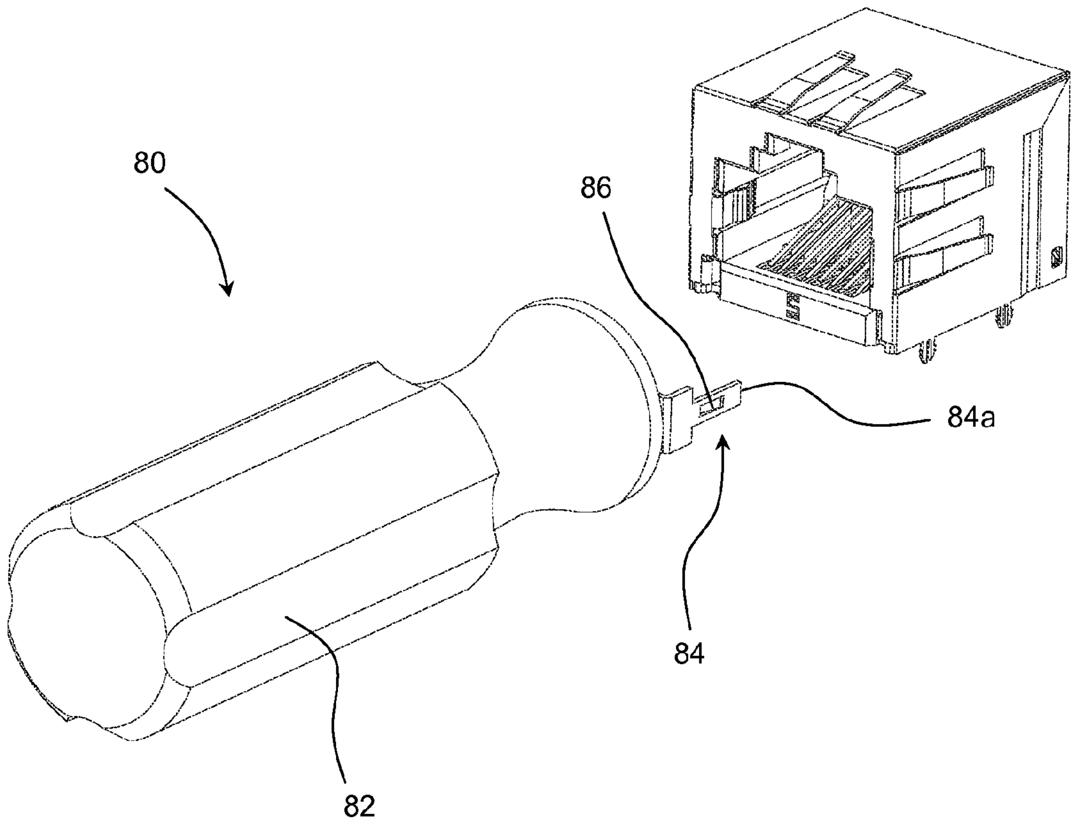
FIG. 7 is a perspective view of a tool for removing the sled from the housing.

FIG. 7 shows an example of a tool 80 that is specially adapted to quickly and easily remove the sled 50 from the housing 20 without damage. The tool 80 includes a handle 82, two flexible prongs 84 extending from an end of the handle 82, and hooks 86 extending inwardly from inside surfaces of the two prongs 84. The free ends 84*a* of the prongs 84 are spaced apart at a distance that is substantially equal to the width of the sled 50, i.e., a distance between the outside surfaces of each of the sides 50*c* of the sled 50. The bumps 54 along the sides of the sled 50 protrude just far enough from the sled 50 to define a gap between the inner surfaces of the lower channels 44 and the remaining portions on the sides 50*c* of the sled, i.e., the portions of the sides 50*c* of the sled 50 other than where the bumps 54 are located.

The gaps between the sides 50*c* of the sled 50 and the lower latches 34 located within the lower channels 44 are preferably just wide enough for the prongs 84 to be inserted therein. The prongs 84 are inserted into the gaps until the free ends 84*a* of the prongs 84 contact the front edges 54*a* of the bumps 54. When the free ends 84*a* of the prongs 84 contact the front edges 54*a* of the bumps 54, the protruding portions 34*a* of the lower latches 34 are forced towards the inner surfaces of the lower channels 44 such that the protruding portions 34*a* of the lower latches 34 no longer engage the front edges 54*a* of the bumps 54. At the same time, the hooks 86 on the inner surfaces of the prongs 84 extend into the slots 55 formed within the sides 50*c* of the sled 50. The hooks 86 engage the front edges of the slots 55. The tool 80 is then pulled away from the opening in the housing 20 with the hooks 86 securely engaging the front edges of the slots 55. The sled 50 is then slid out of the socket through the opening of the housing 20. Thus, the sled 50 is quickly and easily removed from the modular jack 10 without disassembling the housing 20 or removing the housing 20 from the circuit board 70.

The present invention is not limited to the tool described above and may utilize any tool or other unlocking device that is able to remove the sled 50 from the housing 20. The tool may be arranged to "unlock" the sled 50 from the housing 20, i.e., the sled 50 cannot be removed from the housing 20 without the use of the specially adapted tool. The sled 50 may also be inserted into the housing 20 without being "locked" in the housing 20, and, in such a case, this facilitates removal of the sled 50 from the housing 20.

Figure 8:
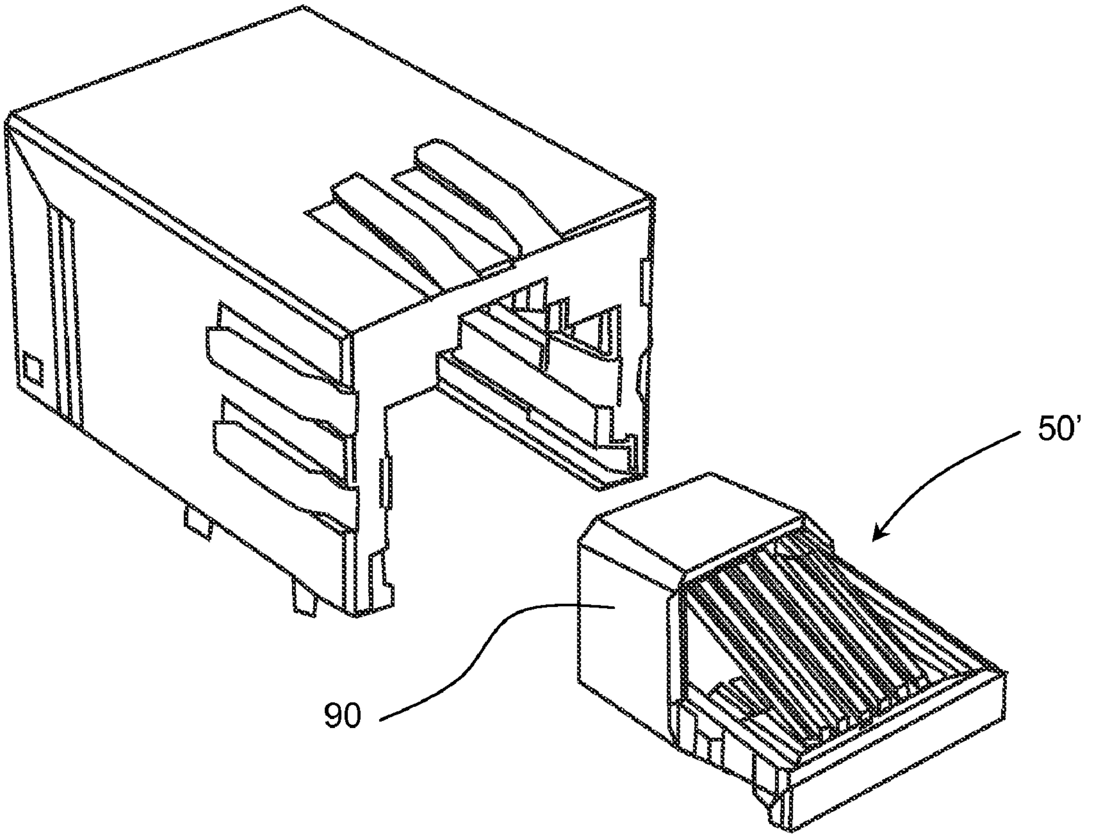
FIG. 8 is a perspective view of the sled with an additional component according to another preferred embodiment of the present invention.

Referring to additional preferred embodiment shown in FIG. 8, the sled 50' may include at least one additional component 90 for modifying the signals transmitted through the modular jack 10. Each signal transmitted through the modular jack 10 may be modified (including not being modified) in a different way. For example, one signal may be filtered and another signal may not. The at least one additional component 90 may include one or more components for amplification, noise suppression or filtration, impedance matching, voltage isolation, magnetic filtering (e.g., "magnetics"), ESD protection, resistive termination, shunt programming, solid state/active compensation, differential signal equalization, etc. The additional components 90 may be attached to a carrier circuit board or one or more leadframes, for example. However, the at least one additional component 90 may be attached via any other suitable device, and by any suitable method, to the sled 50'.

As described above, the contact terminals 52*c* may make contact with the at least one additional component 90 mounted to the sled 50, as opposed to directly contacting the lands 72 on the circuit board 70. Accordingly, the at least one additional component 90 is arranged between the contacts 52 on the sled 50 and the lands 72 on the circuit board 70.

These additional components have far higher failure, repair, and rejection rates than their passive counterparts. The ability to easily inspect and diagnose a bad additional component and then to simply replace with a new additional component by inserting a new sled 50' leads to substantial time and cost savings.

The at least one additional component 90 can also include a mechanical switch. For example, a circuit contained in or on the circuit board 70 can have a first arrangement when the sled 50' is inserted into the opening of the modular jack 10 and can have a second arrangement when a modular plug 60 is inserted into the opening of the modular jack 10. Additionally, unwanted electrical potential may be shunted to ground upon mating the modular plug 60 with the modular jack 10, hence creating a mechanical ESD jack.

The location and number of contacts 52 in the contact array 51 may also be easily reconfigured by removing or rearranging the existing contacts 52 in the contact array 51. The configuration of the contact array 51 may also be changed by merely substituting a sled 50 with a different contact array 51 configuration.

Figure 9:
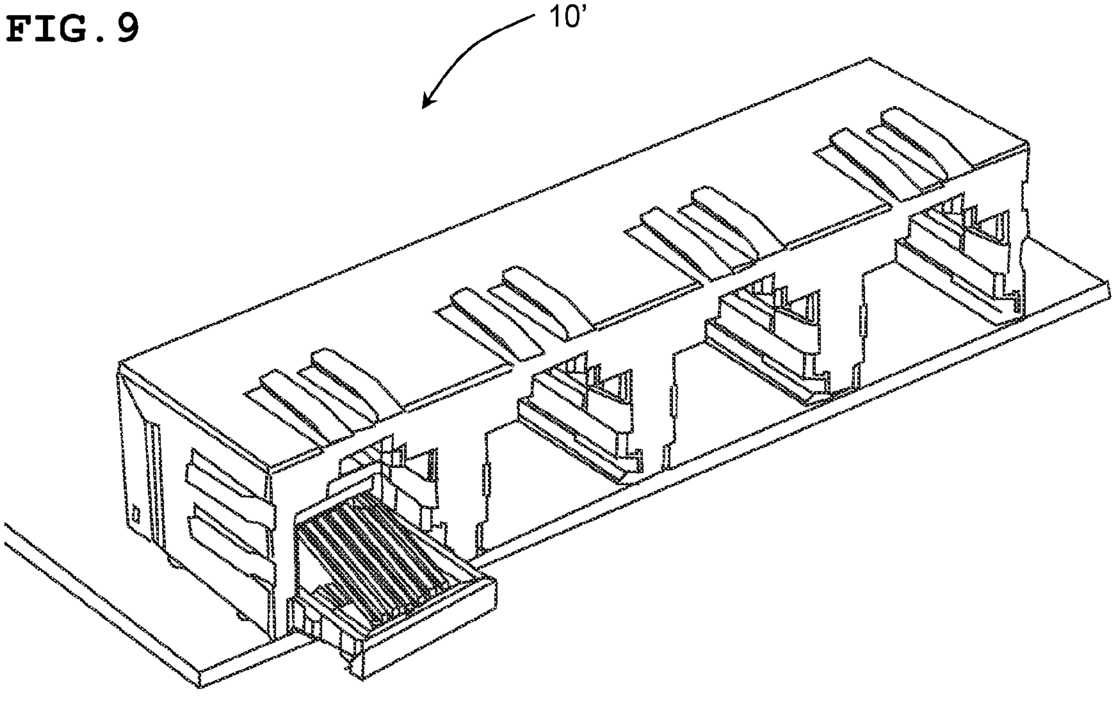
FIG. 9 is a perspective view of a ganged in-line modular jack assembly according to another preferred embodiment of the present invention.
Figure 10:
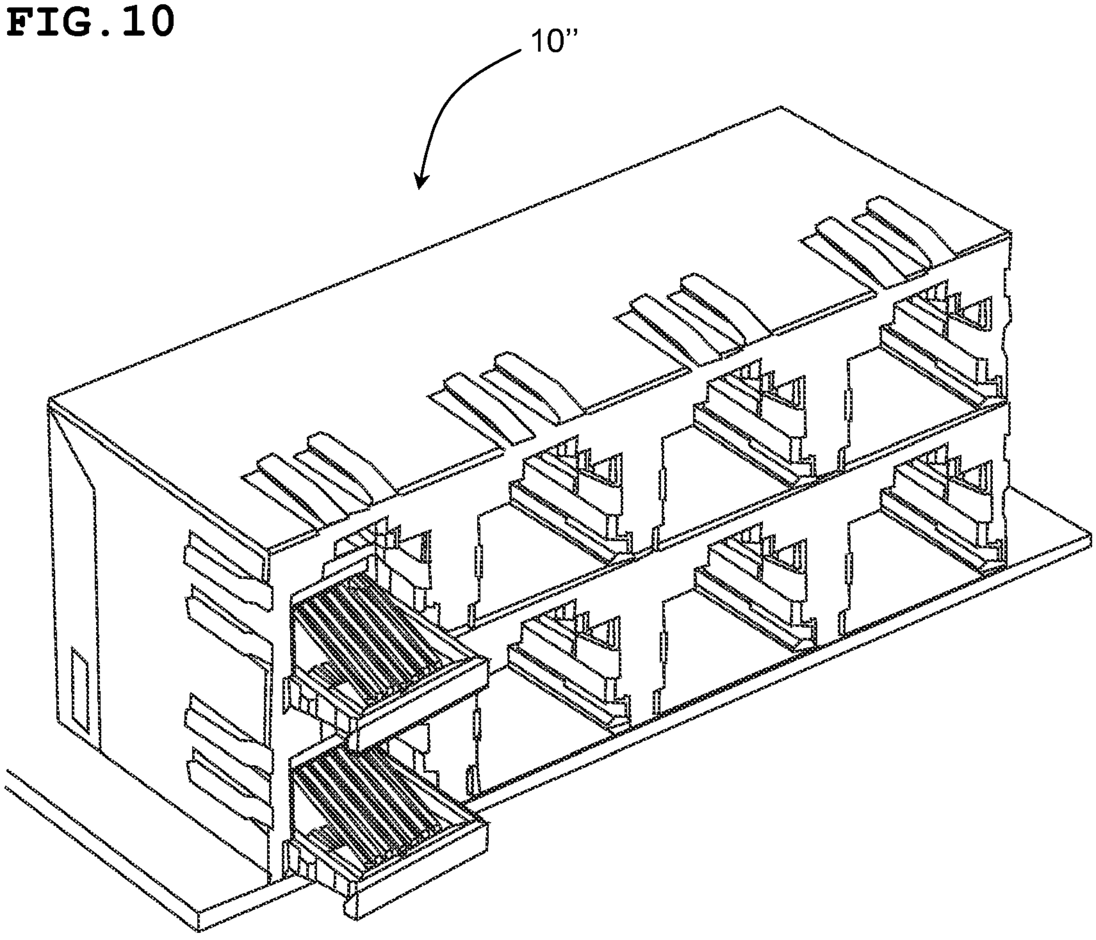
FIG. 10 is a perspective view of a ganged in-line and stacked modular jack assembly according to another preferred embodiment of the present invention.

A modular jack 10' according to another preferred embodiment of the present invention may be ganged in-line, as shown in FIG. 9. Additionally, the modular jack 10" may be ganged in-line and stacked vertically, according to yet another preferred embodiment of the present invention shown in FIG. 10. Although FIG. 10 shows both rows of the openings having a space arranged to receive upwardly facing tabs 62 on the modular plugs 60, the openings may be arranged in any manner including being mirrored such that the upper row has spaces arranged to receive upwardly facing tabs 62 on the modular plugs 60 and the lower row has spaces arranged to receive downwardly facing tabs 62 on the modular plugs 60. Furthermore, ganged in-line modular jacks 10' or ganged in-line and vertically stacked modular jacks 10" may be arranged on opposite sides of a circuit board. In any case, one or more, or all of the modular jacks may include a removable sled. Furthermore, in a ganged in-line modular jack 10' or a ganged in-line and vertically stacked modular jack 10", the spaces may be arranged at the same location in each of the openings of the housing 20, or at different locations.

The modular jack 10 may also include an LED (not shown) to indicate the line status of modular jack 10. The LED may be located on the sled 50 or on the housing 20 of the modular jack 10.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A modular jack comprising:

a housing having a socket and an opening arranged to receive a modular plug into the socket; and a sled including a contact array arranged within the socket; wherein the sled is removable from the socket through the opening of the housing without disassembling the housing.

2. The modular jack according to claim 1, wherein the housing includes a shield and an internal housing.

3. The modular jack according to claim 1, wherein the housing includes at least one element arranged to engage at least one element on the sled; and the sled is locked into the housing when the at least one element of the sled is engaged by the at least one element of the housing.

4. The modular jack according to claim 1, wherein the contact array includes a plurality of contacts arranged to make electrical contact with the modular plug.

5. The modular jack according to claim 1, wherein the contact array includes a plurality of contacts; and each of the contacts is removably mounted in the sled such that the contacts may be selectively removed or inserted therein.

6. The modular jack according to claim 1, wherein the sled includes at least one additional component arranged to modify at least one signal transmitted through the modular jack; and the at least one additional component is arranged on the sled such that the at least one component is removed from the housing when the sled is removed from the housing.

7. The modular jack according to claim 6, wherein the at least one additional component is arranged to modify the signal through at least one of amplification, noise suppression, noise filtration, impedance matching, voltage isolation, magnetic filtering, ESD protection, resistive termination, shunt programming, solid state/active compensation, and differential signal equalization.

8. A modular jack assembly comprising:

a plurality of modular jacks arranged along a line so as to define an in-line configuration; wherein at least one of the plurality of modular jacks is defined by the modular jack according to claim 1.

9. A modular jack assembly comprising:

a plurality of modular jacks stacked vertically on each other; wherein at least one of the plurality of modular jacks is defined by the modular jack according to claim 1.

10. A modular jack assembly comprising:

a modular jack according to claim 1; and a circuit board having at least one electrical contact, the modular jack being mounted on the circuit board; wherein the sled is removable from the socket through the opening of the housing without removing the housing from the circuit board.

11. The modular jack assembly according to claim 10, wherein the contact array includes a plurality of contacts, each having a terminal end; and the terminal end of each of the plurality of contacts is in direct contact with a corresponding one of the at least one electrical contact of the circuit board.

12. The modular jack assembly according to claim 10, wherein the sled includes at least one additional component arranged to modify at least one signal transmitted through the modular jack; and the at least one additional component is arranged on the sled such that the at least one additional component is removed from the housing when the sled is removed from the housing.

13. The modular jack according to claim 12, wherein the at least one additional component is arranged to modify the signal through at least one of amplification, noise suppression, noise filtration, impedance matching, voltage isolation, magnetic filtering, ESD protection, resistive termination, shunt programming, solid state/active compensation, and differential signal equalization.

14. The modular jack assembly according to claim 12, wherein the contact array includes a plurality of contacts; and the at least one additional component is arranged between at least one of the plurality of contacts and the at least one electrical contact of the circuit board.

15. An electronic device including the modular jack of claim 1.

16. An electronic device including the modular jack assembly of claim 10.

* * * * *